United States Patent
Popp et al.

(10) Patent No.: US 10,224,375 B2
(45) Date of Patent: Mar. 5, 2019

(54) ORGANIC OPTOELECTRONIC COMPONENT

(71) Applicant: OSRAM OPTO SEMICONDUCTORS GMBH, Regensburg (DE)

(72) Inventors: Michael Popp, Freising (DE); Marc Philippens, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 306 days.

(21) Appl. No.: 14/650,268

(22) PCT Filed: Dec. 3, 2013

(86) PCT No.: PCT/EP2013/075394
§ 371 (c)(1),
(2) Date: Jun. 5, 2015

(87) PCT Pub. No.: WO2014/090636
PCT Pub. Date: Jun. 19, 2014

(65) Prior Publication Data
US 2015/0349036 A1    Dec. 3, 2015

(30) Foreign Application Priority Data
Dec. 11, 2012  (DE) .......... 10 2012 222 772

(51) Int. Cl.
*H01L 27/28* (2006.01)
*H01L 23/535* (2006.01)
(Continued)

(52) U.S. Cl.
CPC ........ *H01L 27/288* (2013.01); *H01L 23/3121* (2013.01); *H01L 23/535* (2013.01);
(Continued)

(58) Field of Classification Search
CPC . H01L 27/288; H01L 23/3121; H01L 23/535; H01L 27/3204; H01L 27/3225; H01L 2924/0002
See application file for complete search history.

(56) References Cited

U.S. PATENT DOCUMENTS 7,405,775 B2   7/2008  Nilsson
8,053,792 B2 * 11/2011  Lee ..................... H01L 27/15
                                                257/89
(Continued)

FOREIGN PATENT DOCUMENTS

DE   202004011869 U1  12/2005
WO   2010066245 A1   6/2010

*Primary Examiner* — William F Kraig
*Assistant Examiner* — Khatib A Rahman
(74) *Attorney, Agent, or Firm* — Slater Matsil, LLP

(57) ABSTRACT

An organic optoelectronic component includes an organic light-emitting element and an organic protective diode element. The organic light-emitting element includes an organic functional layer stack having at least one organic light-emitting layer between two electrodes. The organic protective diode element includes an organic functional layer stack having an organic pn-junction between two electrodes and is arranged on a shared substrate in laterally adjacent area regions with the organic light-emitting element.

19 Claims, 4 Drawing Sheets

(51) Int. Cl.
*H01L 27/32* (2006.01)
*H01L 23/31* (2006.01)
(52) U.S. Cl.
CPC ...... *H01L 27/3204* (2013.01); *H01L 27/3225* (2013.01); *H01L 2924/0002* (2013.01)

(56) References Cited

U.S. PATENT DOCUMENTS

| | | |
|---|---|---|
| 2004/0032220 A1 | 2/2004 | Cok et al. |
| 2004/0095300 A1* | 5/2004 | So .................. G09G 3/3216 345/82 |
| 2005/0072971 A1* | 4/2005 | Marrocco, III ........ B82Y 30/00 257/40 |
| 2005/0179042 A1* | 8/2005 | Yang .................... H01L 27/153 257/84 |
| 2006/0202920 A1* | 9/2006 | Shibusawa ............ G09G 3/325 345/76 |
| 2011/0025212 A1 | 2/2011 | Kolosov et al. |
| 2011/0084624 A1 | 4/2011 | Dekker et al. |
| 2012/0091923 A1 | 4/2012 | Kastner-Jung et al. |
| 2012/0244644 A1* | 9/2012 | Wang .................... H01L 51/56 438/5 |
| 2013/0217168 A1* | 8/2013 | Hartmann ............. H01L 51/448 438/64 |
| 2014/0361279 A1* | 12/2014 | Schicktanz ............ H01L 51/50 257/40 |
| 2015/0053932 A1* | 2/2015 | Lin .................... H01L 27/3244 257/40 |
| 2015/0144897 A1* | 5/2015 | Kang .................. H01L 51/5076 257/40 |

* cited by examiner

ORGANIC OPTOELECTRONIC COMPONENT

This patent application is a national phase filing under section 371 of PCT/EP2013/075394, filed Dec. 3, 2013, which claims the priority of German patent application 10 2012 222 772.5, filed Dec. 11, 2012, each of which is incorporated herein by reference in its entirety.

TECHNICAL FIELD

An organic optoelectronic component is specified.

BACKGROUND

An organic light-emitting diode (OLED) must be interconnected correctly polarized in operation with DC voltage or direct current. In the event of incorrect polarization, the risk exists of an electrical breakthrough and therefore the destruction of the OLED, for example, by the fusing of organic materials at weak points.

In the case of serial interconnection of a plurality of OLEDs which have symmetrical polarization in the construction, in the event of polarity reversal of one of the OLEDs at a constant voltage supply it is not possible to recognize which OLED was incorrectly installed because of at least one blocked pn-junction.

A visual check during the installation of the OLEDs is, on the one hand, susceptible to errors because of a high risk of confusion of the poles and, on the other hand, linked to a large time expenditure during the removal and installation.

In contrast, if components are used in which the polarity cannot be transposed, for example, due to the use of flex strips with pin, additional costs and additional structural measures are necessary on the components in the backend process.

SUMMARY

Embodiments specify an organic optoelectronic component having a protective diode element.

According to at least one embodiment, an organic optoelectronic component has an organic light-emitting element, which has an organic functional layer stack having at least one organic light-emitting layer between two electrodes. In particular, the organic light-emitting element is implemented as an organic light-emitting diode (OLED), which can emit visible light through at least one of the electrodes in operation. At least one of the electrodes is implemented as transparent for this purpose.

Here and hereafter, "transparent" refers to a layer which is transmissive to visible light. In this case, the transparent layer can be clearly transparent or also at least partially light-scattering and/or partially light-absorbing, so that a layer referred to as transparent can also be, for example, diffuse or translucent. A layer referred to as transparent here is particularly preferably implemented as transmissive as possible to visible light that in particular the absorption of light generated in the organic light-emitting element is as little as possible.

For example, a transparent electrode can be made of or can have a transparent conductive oxide (TCO). Furthermore, a transparent electrode can have a transparent metal, i.e., a metal having a thickness which is sufficiently low that the electrode is at least partially transmissive to light. Furthermore, a transparent electrode can also be implemented as a ring contact. Here and hereafter, any form of an electrode is referred to as a "ring contact", which has an opening which is entirely or also only partially enclosed in the lateral direction by electrode material. In particular, a U-shaped electrode, for example, can also fall under the term ring contact. Furthermore, an electrode referred to as a ring contact can also have a plurality of openings. Furthermore, a transparent electrode can have, for example, metallic network structures, graphene, or a combination of the mentioned transparent materials.

The other of the two electrodes, between which the organic functional layer stack of the organic light-emitting element is located, can be implemented as reflective and can have a metal, for example. Alternatively thereto, both electrodes can also be implemented as transparent. In this case, the organic light-emitting element can be implemented in particular as a transparent OLED.

Furthermore, the organic optoelectronic component has an organic protective diode element. The organic protective diode element has an organic functional layer stack having an organic pn-junction between two electrodes.

Furthermore, the organic optoelectronic component has a shared substrate for the organic light-emitting element and the organic protective diode element, which are arranged in particular on the shared substrate in laterally adjacent area regions. The shared substrate can be in particular the only substrate of the organic optoelectronic component. The functional layer stacks and the electrodes of the organic light-emitting element and the organic protective diode element are applied successively in particular on the shared substrate in this case, so that the shared substrate is the substrate which is required and provided for producing the organic light-emitting element and the organic protective diode element. In other words, the organic elements are not produced on separate substrates and then arranged on the shared substrate, but rather are produced on the shared substrate. Therefore, in this case no further substrate is arranged in particular between the shared substrate and the organic functional layers of the organic electronic elements, i.e., of the organic light-emitting element and the organic protective diode element.

Here and hereafter, "lateral" refers to a direction in parallel to the main extension plane of the shared substrate. A lateral direction is therefore, for example, oriented perpendicularly to the stack direction of the electrodes and of the organic functional layer stack of the at least one organic light-emitting element.

In particular, the organic light-emitting element and the organic protective diode element are arranged on the same side of the shared substrate. Particularly preferably, with regard to further organic electronic elements, i.e., further light-emitting elements and/or further organic protective diode elements, which can be arranged on the shared substrate, the organic light-emitting element can be directly adjacent to the organic protective diode element, i.e., no further organic electronic elements are provided in the lateral direction between the organic light-emitting element and the organic protective diode element.

According to a further embodiment, the organic protective diode element is implemented as an organic light-emitting element. In particular, the organic protective diode element can be implemented in this case as an OLED and can have an organic pn-junction, which is implemented as an organic light-emitting layer. If the organic pn-junction is operated in the forward direction in this case, the organic protective diode element can generate light, while the organic protective diode element is blocking to a current flow in the event of operation in the blocking direction.

According to a further embodiment, the organic protective diode element is implemented as an organic light-detecting element, in particular as an organic photodiode. This means in particular that the organic protective diode element has the same structure as an organic photodiode. The organic photodiode can in particular have an organic functional layer stack between two electrodes, wherein the organic functional layer stack has the pn-junction as the organic light-detecting layer for generating charge carriers.

For example, the organic protective diode element can have, in regard to the electrodes and the organic functional layer stack, also in the case that the organic protective diode element is implemented as an organic light-emitting element and/or as an organic light-detecting element, the same structure as the organic light-emitting element, whereby it can be possible that the manufacturing of the organic optoelectronic component causes no or only minor additional costs in comparison to an exclusively light-emitting component. Alternatively thereto, the organic protective diode element can have other materials and/or other layer structures with regard to the electrodes and/or the organic functional layer stack in comparison to the organic light-emitting element, whereby an additional expenditure can be necessary in the manufacturing, but also, for example, the diode properties and/or a current and/or voltage strength of the organic protective diode element can be adapted in a targeted manner.

According to a further embodiment, the organic light-emitting element and the organic protective diode element are interconnected in antiparallel. For example, the organic optoelectronic component can have an external interconnection, an internal interconnection, or a combination thereof for this purpose. If the organic optoelectronic component has an external interconnection for at least one electrode of the organic light-emitting element and one electrode of the organic protective diode element, the organic optoelectronic component can thus have, for example, an external wiring or interconnection, for example, in the form of a flex contact, by means of which the respective electrodes of the organic light-emitting element and the organic protective diode element are interconnected. If the organic optoelectronic component has an internal interconnection for at least one electrode of the organic light-emitting element and one electrode of the organic protective diode element, the respective electrodes of the organic light-emitting element and the organic protective diode element are thus interconnected to one another by an electrically conductive element of the organic optoelectronic component, for example, in the form of an electrically conductive layer, in the form of a part of an electrode, in the form of a conductor track, or in the form of an electrode terminal part. For example, the internal interconnection can be performed by an electrode terminal part, which is applied to the substrate.

According to a further embodiment, an electrode, which is arranged between the organic functional layer stack and the substrate, of the organic light-emitting element is internally interconnected to an electrode of the organic protective diode element, which is arranged on a side of the organic functional layer stack of the organic protective diode element facing away from the substrate.

According to a further embodiment, an electrode, which is arranged between the organic functional layer stack and the substrate, of the organic protective diode element is internally interconnected to an electrode of the organic light-emitting element, which is arranged on a side of the organic functional layer stack of the organic light-emitting element facing away from the substrate.

According to a further embodiment, the organic protective diode element is implemented as smaller with respect to its area occupation on the shared substrate than the organic light-emitting element. In particular, the organic protective diode element can cover an area on the shared substrate which is less than or equal to 10% or also less than or equal to 5% or also less than or equal to 1% of the area which is covered by the organic light-emitting element on the shared substrate. In other words, the predominant part of the shared substrate can be covered with the organic light-emitting element or also with a plurality of organic light-emitting elements, while the organic protective diode element or also a plurality of organic protective diode elements only occupy a small area region, so that the organic optoelectronic component has an illuminated area in operation which can correspond to essentially the entire area of the shared substrate.

According to at least one further embodiment, the organic optoelectronic component has an encapsulation on the organic light-emitting element and/or on the organic protective diode element. The encapsulation can be formed, for example, by a so-called thin-film encapsulation, which has at least one or more thin layers, which is applied by means of a deposition method, preferably by means of a chemical gas phase deposition method and/or an atomic layer deposition method, onto the organic light-emitting element and/or onto the organic protective diode element. Alternatively or additionally, the encapsulation can also have a glass cover, for example, which is glued over the organic light-emitting element and/or over the organic protective diode element on the shared substrate.

According to a further embodiment, the organic light-emitting element and the organic protective diode element are encapsulated using a shared encapsulation. In other words, this means that an encapsulation is applied to the organic light-emitting element and the organic protective diode element, which extends coherently at least over both elements. Alternatively thereto, the organic light-emitting element and the organic protective diode element can have encapsulations separate from one another.

In the organic optoelectronic component described here, an organic protective diode element can be produced monolithically together with an organic light source in the form of the organic light-emitting element, that is, on the same substrate. In particular for the case in which the organic protective diode element has an identical layer structure as the organic light-emitting element, the organic optoelectronic component described here can be provided with a protective diode without additional effort and without additional costs in comparison to an organic component which is only light-emitting. The organic protective diode element can in particular have a smaller area in comparison to the organic light-emitting element.

The organic protective diode element can be interconnected by an antiparallel circuit to the organic light-emitting element, so that in the event of incorrect polarization of the organic optoelectronic component during the electrical connection, current does not flow through the organic light-emitting element, but rather through the organic protective diode element. The organic light-emitting element can thus be protected in the event of a polarity reversal. In contrast, an external protective diode is not necessary as a polarity reversal protection, whereby a cost reduction and a possibility for miniaturization result in comparison to known solutions.

If the organic protective diode element is implemented as an organic light-emitting element, the organic protective diode element can thus emit light in the case of an incorrect polarization, whereby a direct optical display of the polarity reversal is achieved. In the event of incorrect installation of the organic optoelectronic component, in particular in a series circuit of a plurality of organic optoelectronic components, a greatly reduced installation effort results, since it is not necessary to search for the incorrectly polarized component.

BRIEF DESCRIPTION OF THE DRAWINGS

Further advantages, advantageous embodiments, and refinements result from the exemplary embodiments described hereafter in conjunction with the figures.

In the figures.

In the exemplary embodiments and figures, identical, similar, or identically acting elements can each be provided with the same reference signs. The illustrated elements and the size relationships thereof to one another are not shown to scale, rather, individual elements, for example, layers, parts, components, and regions can be shown exaggeratedly large for better illustration ability and/or for better comprehension.

DETAILED DESCRIPTION OF ILLUSTRATIVE EMBODIMENTS

Figure 1:
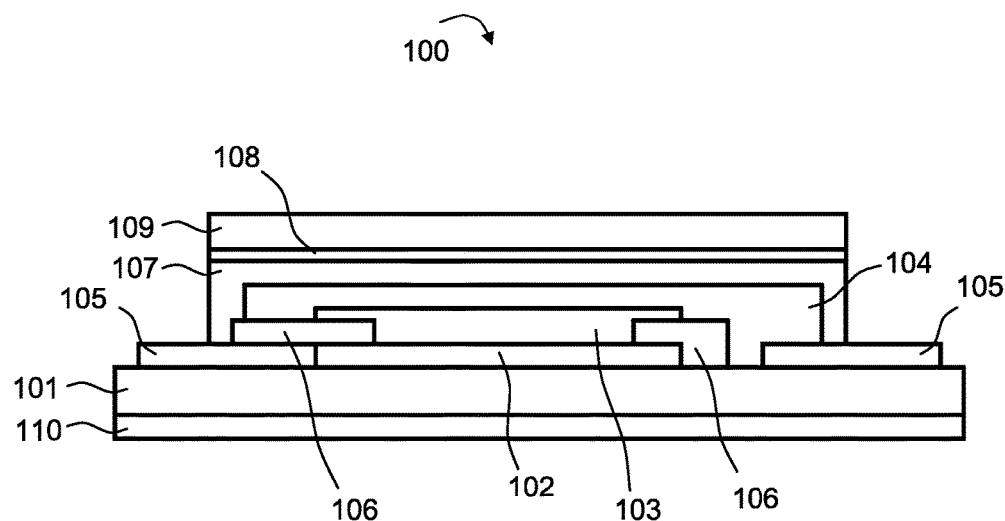
FIG. 1 shows a schematic illustration of an organic light-emitting element according to one exemplary embodiment.

FIG. 1 shows the schematic structure of an organic light-emitting element 100 according to one exemplary embodiment, which is implemented as an organic light-emitting diode (OLED).

The organic light-emitting element 100, which can also be referred to as OLED 100 hereafter, has a substrate 101, on which an organic functional layer stack 103 having at least one organic light-emitting layer is arranged between the electrodes 102 and 104. At least one of the electrodes 102, 104 is implemented as transparent, so that in operation of the OLED 100, the light generated in the organic functional layer stack 103 can be emitted through the at least one transparent electrode.

In the OLED 100 shown in FIG. 1, the substrate 101 is embodied as transparent, for example, in the form of a glass plate or glass layer. Alternatively thereto, the substrate 101 can also have, for example, a transparent plastic or a glass-plastic laminate. The substrate can be implemented as rigid, i.e., not flexible, or as flexible.

The electrode 102 applied to the substrate 101 is also implemented as transparent and has, for example, a transparent conductive oxide. Transparent conductive oxides (TCO) are transparent, conductive materials, generally metal oxides, for example, zinc oxide, tin oxide, cadmium oxide, titanium oxide, indium oxide, and indium tin oxide (ITO). In addition to binary metal oxygen compounds, for example, $ZnO$, $SnO_2$, or $In_2O_3$, the group of TCOs also includes ternary metal oxygen compounds, for example, $Zn_2SnO_4$, $CdSnO_3$, $ZnSnO_3$, $MgIn_2O_4$, $GaInO_3$, $Zn_2In_2O_5$, or $In_4Sn_3O_{12}$, or mixtures of different transparent conductive oxides. Furthermore, the TCOs do not necessarily correspond to a stoichiometric composition and can also be p-doped or n-doped. Furthermore, a transparent electrode can also have, for example, a transparent metal, metallic network structures, or conductive networks, for example, having or made of silver, and/or graphene or carbonaceous layers or a combination of the mentioned transparent materials.

The further electrode 104 on the organic functional layer stack 103 is implemented as reflective in the exemplary embodiment shown and has a metal which can be selected from aluminum, barium, indium, silver, gold, magnesium, calcium, and lithium and also compounds, combinations, and alloys therewith. In particular, the electrode 104 can have Ag, Al or alloys or layer stacks with these, for example, Ag/Mg, Ag/Ca, Mg/Al, or also Mo/Al/Mo or Cr/Al/Cr. Alternatively or additionally, the electrode 104 can also have an above-mentioned TCO material or a layer stack having at least one TCO and at least one metal.

The lower electrode 102 is implemented as the anode in the exemplary embodiment shown, while the upper electrode 104 is implemented as the cathode. With corresponding material selection, however, a reversed structure with respect to the polarity is also possible.

The electrodes 102, 104 are preferably implemented as large-area and coherent, so that the organic light-emitting element 100 is formed as a light source, in particular as a surface light source. "Large-area" can mean in this case that the organic light-emitting element 100 has an area of greater than or equal to several square millimeters, preferably greater than or equal to one square centimeter, and particularly preferably greater than or equal to one square decimeter. Alternatively thereto, it can also be possible that at least one of the electrodes 102, 104 of the organic light-emitting element 100, between which the organic functional layer stack 103 is located, is implemented as structured, whereby a spatially and/or chronologically structured and/or variable light impression, for example, for structured illumination or for a display device, can be enabled by means of the organic light-emitting element 100.

As shown in FIG. 1, electrode terminal parts 105, which extend outward under the encapsulation 107 described hereafter through from the electrodes 102, 104, can also be used for the electrical contacting of the electrodes 102 and 104. The electrode terminal parts 105, which are implemented as electrical contact feeds, can be implemented as transparent or nontransparent depending on the emission direction of the OLED 100 and can have or be made of a TCO and/or a metal, for example. The electrode terminal parts 105 can be formed, for example, by a metal layer or a metal layer stack, for example, Mo/Al/Mo, Cr/Al/Cr, or Al.

The organic functional layer stack 103 can have further organic layers in addition to the at least one organic light-emitting layer, for example, one or more selected from a hole injection layer, a hole transport layer, an electron blocking layer, a hole blocking layer, an electron transport layer, an electron injection layer, and a charge generation layer (CGL), which are capable of conducting holes or electrons to the organic light-emitting layer or blocking the respective transport, respectively. The layers of the organic functional layer stack 103 can have organic polymers, organic oligomers, organic monomers, organic small, non-polymer molecules ("small molecules"), or combinations thereof. In particular, it can be advantageous if the organic functional layer stack 103 has a functional layer which is embodied as a hole transport layer, to enable an effective hole injection into the organic light-emitting layer. For example, tertiary amines, carbazole derivatives, conductive polyaniline, or polyethylene dioxythiophene can prove to be advantageous as materials for a hole transport layer. Electroluminescent materials which have a radiation emission because of fluorescence or phosphorescence are suitable as materials for the light-emitting layer, for example, polyfluorene, polythiophene, or polyphenylene or derivatives, compounds, mixtures, or copolymers thereof.

Furthermore, as shown in FIG. 1, insulator layers 106 can be provided, for example, with or made from polyimide, which can electrically insulate the electrodes 102, 104 from one another, for example. Depending on the embodiment of the individual layers of the OLED 100, insulator layers 106 do not also have to be absolutely necessary and may not be provided, for example, in the event of corresponding mask processes for applying the layers.

An encapsulation 107 for protecting the organic functional layer stack 103 and the electrodes 102, 104 is arranged over the organic functional layer stack 103 and the electrodes 102, 104. The encapsulation 107 is particularly preferably embodied as a thin-film encapsulation in this case.

An encapsulation implemented as a thin-film encapsulation is understood in the present case as a device which is capable of forming a barrier against atmospheric materials, in particular against moisture and oxygen and/or against further damaging substances, such as corrosive gases, for example, hydrogen sulfide. In other words, the thin-film encapsulation is implemented such that at most very small fractions of atmospheric materials can penetrate it. This barrier action is essentially created in the thin-film encapsulation by barrier layers and/or passivation layers, which are embodied as thin layers, and which are part of the encapsulation. The layers of the encapsulation generally have a thickness of less than or equal to several hundreds of nanometers.

In particular, the thin-film encapsulation can have thin layers or can consist thereof, which are responsible for the barrier action of the encapsulation. The thin layers can be applied, for example, by means of an atomic layer deposition method (ALD) or a molecular layer deposition method (MLD). Suitable materials for the layers of the encapsulation arrangement are, for example, aluminum oxide, zinc oxide, zirconium oxide, titanium oxide, hafnium oxide, lanthanum oxide, tantalum oxide. The encapsulation preferably has a layer sequence having a plurality of the thin layers, which each have a thickness between one atomic layer and several hundreds of nanometers.

Alternatively or additionally to thin layers produced by means of ALD or MLD, the encapsulation can have at least one or a plurality of further layers, i.e., in particular barrier layers and/or passivation layers, which are deposited by thermal deposition or by means of a plasma-enhanced process, such as sputtering, chemical gas phase deposition ("chemical vapor deposition", CVD) or plasma-enhanced chemical gas phase deposition ("plasma enhanced chemical vapor deposition", PECVD). Suitable materials for this purpose can be the above-mentioned materials and also silicon nitride, silicon oxide, silicon oxynitride, indium tin oxide, indium zinc oxide, aluminum-doped zinc oxide, aluminum oxide, and mixtures and alloys of the mentioned materials. The one or the multiple further layers can each have a thickness, for example, between 1 nm and 5 μm and preferably between 1 nm and 400 nm, wherein the limits are included.

Alternatively or additionally to a thin-film encapsulation, the encapsulation 107 can also have a glass cover, which is glued onto the substrate 101, for example, by means of an adhesive layer, in the form of a glass substrate having a cavity. Furthermore, a moisture-absorbing material (getter), for example, made of zeolite, can be glued into the cavity, to bind moisture, oxygen, or other damaging gases, which can penetrate through the adhesive.

Furthermore, a cover 109 glued on by means of an adhesive layer 108 can be arranged on the encapsulation 107, as seen from the substrate 101, as shown in FIG. 1. The cover 109, which can also be referred to as a "superstrate" with regard to its arrangement in comparison to the substrate 101, can be formed, for example, by a glass layer or glass plate or also a plastic, a metal, or a combination or a laminate of the mentioned materials, and in particular can be used as a mechanical protection, in particular as a scratch protection, in conjunction with an encapsulation 107 implemented as a thin-film encapsulation, without the cover 109 itself having to have an encapsulating effect.

The OLED 100 is embodied as a so-called bottom emitter because of the transparent substrate 101 and the transparent lower electrode 102, and in operation emits light through the transparent electrode 102 and the transparent substrate 101. To improve the light decoupling, as shown in FIG. 1, an optical decoupling layer 110 can be arranged on the side of the substrate 101 facing away from the organic functional layer stack 103, which is implemented, for example, as a scattering layer having scattering particles in a transparent matrix and/or having a light-scattering surface structure. A decoupling layer can also be arranged, for example, between the substrate 101 and the lower electrode 102 arranged on the substrate 101 or between other functional layers in the form of an internal decoupling layer.

Alternatively to the described bottom-emitter configuration, the upper electrode 104 arranged facing away from the substrate 101 can also be implemented as transparent, to emit the light generated in operation in the organic functional layer stack 103 through the upper electrode 104 in a direction facing away from the substrate 101. In this case, the OLED 100 is implemented as a so-called top emitter. The lower electrode 102, which is arranged between the substrate 101 and the organic functional layer stack 103, can also be implemented as reflective, if no light emission is desired through the substrate 101. In this case, the substrate 101 can also have a nontransparent material, for example, a nontransparent glass, a nontransparent plastic, a metal, or combinations thereof. In addition to the upper electrode 104, in the top-emitter configuration, the encapsulation 107 and, if provided, also the adhesive layer 108 and the cover 109 are also implemented as transparent. Furthermore, in this case a decoupling layer can be arranged above the upper electrode 104, for example, on the cover 109 or between the cover 109 and the encapsulation 107.

Furthermore, the OLED 100 can also simultaneously be implemented as a bottom emitter and as a top emitter and therefore preferably as a transparent OLED and can have a combination of the respective features cited in conjunction with the bottom-emitter and top-emitter configurations.

With regard to further features of the organic light-emitting element 100, for example, with regard to the structure, the layer composition, and the materials of the organic functional layer stack, the electrodes, and the encapsulation, reference is made to document WO 2010/066245 A1, which is hereby expressly incorporated by reference with regard to the structure of an organic light-emitting component and also in consideration of modifications and variations of the organic light-emitting element shown in FIG. 1.

The exemplary embodiments shown hereafter each have an organic light-emitting element 100, which can be implemented according to the exemplary embodiment of FIG. 1 or can have modifications or variations thereof. In particular, the features of the schematic structure of the organic light-emitting element 100 shown in FIG. 1 are not to be understood as restrictive for the following exemplary embodiments. Although a decoupling layer 110 is not shown in the following figures, the organic optoelectronic component shown therein can have, depending on the implementation as a one-sided or two-sided emitting component, one or more decoupling layers on one or on both emission sides.

Figure 2:
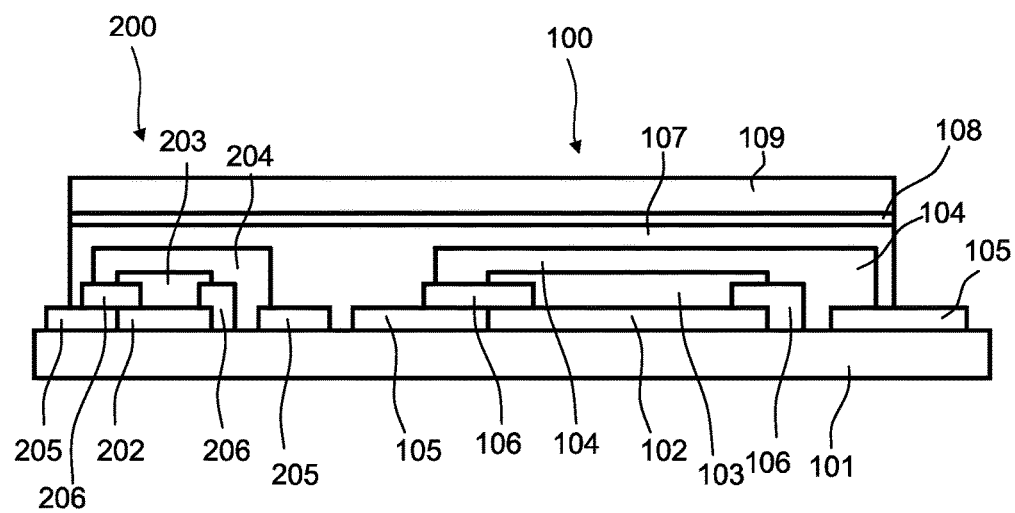
FIG. 2 shows a schematic illustration of an organic optoelectronic component according to a further exemplary embodiment.

FIG. 2 shows an organic optoelectronic components according to one exemplary embodiment which has an organic protective diode element 200 in addition to an organic light-emitting element 100. The organic protective diode element 200 is arranged together with the organic light-emitting element 100 on the substrate 101, so that the substrate 101 forms a shared substrate for the organic light-emitting element 100 and the organic protective diode element 200. In particular, the organic light-emitting element 100 and the organic protective diode element 200 are arranged on the same side of the shared substrate 101 in laterally adjacent area regions.

The organic protective diode element 200 has an organic functional layer stack 203 between two electrodes 202, 204, wherein the organic functional layer stack 203 has an organic pn-junction. In the exemplary embodiment shown, the organic protective diode element 200 is implemented and usable as an organic light-emitting element. For this purpose, the organic pn-junction is implemented as an organic light-emitting layer.

In particular, the organic protective diode element 200 has, in the exemplary embodiment shown, the same structure with regard to the electrodes 202, 204 and the organic functional layer stack 203 as the organic light-emitting element 100 with regard to the electrodes 102, 104 and the organic functional layer stack 103. The manufacturing of the organic optoelectronic component shown thus can cause no or only minor additional costs in comparison to an exclusively light-emitting component. Alternatively thereto, the organic protective diode element 200 can have, in comparison to the organic light-emitting element 100, other materials and/or other layer structures with regard to the electrodes 202, 204 and/or the organic functional layer stack 203, for example, to achieve a desired current and/or voltage capacity. The organic protective diode element 200 can furthermore also be implemented as an organic photodiode, i.e., can have a layer structure of an organic photodiode.

In particular, the organic protective diode element 200 in the exemplary embodiment shown has the same terminal polarity as the organic light-emitting element 100. This means, in the case described above in conjunction with FIG. 1, in which the electrode 102 is implemented as the anode and the electrode 104 is implemented as the cathode of the organic light-emitting element 100, that the electrode 202 is implemented as the anode and the electrode 204 is implemented as the cathode of the organic protective diode element 200. Alternatively thereto, however, it is also conceivable that the organic protective diode element 200 is implemented as inverted with regard to its layer structure, so that the terminal polarity is inverted in comparison to the organic light-emitting element 100.

The organic protective diode element 200 can, as shown in FIG. 2, be arranged on the edge or adjacent to the organic light-emitting element 100 on the substrate 101. Alternatively thereto, the organic protective diode element 200 can also be at least partially enclosed by the organic light-emitting element 100 and therefore can be arranged inside the illuminated area of the organic light-emitting element 100. Furthermore, it is also possible that the organic optoelectronic component has, for example, a plurality of organic light-emitting elements, which are interconnected in parallel or in series with one another and thus form an illumination unit.

The organic optoelectronic component furthermore has an encapsulation 107, which is implemented as a thin-film encapsulation and which forms a shared encapsulation for the organic light-emitting element 100 and the organic protective diode element 200. In other words, the encapsulation 107 extends in a large area and coherently over the functional layers of the organic light-emitting element 100 and the organic protective diode element 200. A shared cover 109 is fastened by means of an adhesive layer 108 on the shared encapsulation 107. Alternatively to a shared encapsulation, the organic light-emitting element 100 and the organic protective diode element 200 can also be protected by encapsulations which are separate from one another.

Furthermore, electrode terminal parts 205 are provided, which are used for the electrical contacting of the electrodes 202, 204 of the organic protective diode element 200 and which can be implemented like the electrode terminal parts 105 of the organic light-emitting element 100. The electrode terminal parts 105, 205 extend outward from the elements 100, 200 out of the encapsulation 107, so that the elements 100, 200 can be externally contacted.

Furthermore, an electric insulator layer can be arranged between the organic light-emitting element 100 and the organic protective diode element 200 on the substrate 101, which insulator layer can have, for example, polyimide or another electrically insulating material or can be made thereof and which can be used for the electrical insulation of the organic protective diode element 200 from the organic light-emitting element 100, so that the electrode terminal parts 105, 205 of the elements 100, 200 can also be arranged at a slight distance from one another on the shared substrate 101, without undesired electrical cross-talk occurring between the elements 100, 200.

The organic light-emitting element 100 and the organic protective diode element 200 are furthermore interconnected in antiparallel, as is also indicated on the basis of circuit diagrams in FIGS. 3A to 3D described hereafter. The electrode terminal parts 105, 205 can be provided in particular for the interconnection. For example, the organic optoelectronic component can have an external interconnection, in which in each case the cathode of one of the elements 100, 200 is electrically interconnected to the anode of the other of the elements 100, 200. For this purpose, for example, an external wiring or interconnection, for example, in the form of a flex contact, can be provided. At least one electrode of one of the elements 100, 200 and one electrode of the other of the elements 100, 200 can also be internally interconnected to one another, as described hereafter in conjunction with FIGS. 4A and 4B. Furthermore, the elements 100, 200 can also only be internally interconnected to one another, so that in this case only a cathode terminal and an anode terminal must be provided on the substrate 101 of the organic optoelectronic component to connect the component to an external current and/or voltage supply.

Figure 3A:
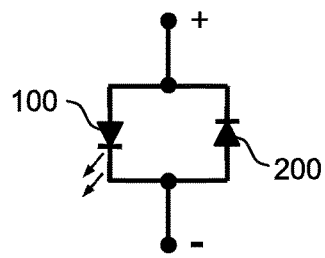
FIGS. 3A to 3D show circuit diagrams having organic optoelectronic components according to further exemplary embodiments.
Figure 3B:
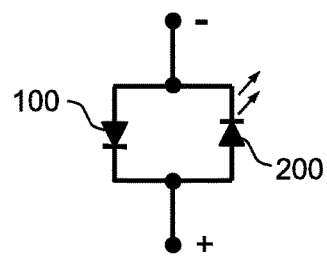

FIGS. 3A to 3D show circuit diagrams having the organic optoelectronic component according to the preceding exemplary embodiment. In FIGS. 3A and 3B, an organic optoelectronic component having the organic electronic elements 100, 200 interconnected in antiparallel is shown in each case.

In FIG. 3A, the organic optoelectronic component is correctly connected with respect to its terminal polarization, so that the organic light-emitting element 100 is operated in the forward direction and emits light, while the organic protective diode element 200 is operated in the blocking direction and therefore does not illuminate. In contrast, in FIG. 3B, the organic optoelectronic component is connected with reversed polarity, so that the organic light-emitting element 100 is contacted in the blocking direction and therefore does not illuminate. In contrast, the organic protective diode element 200 is operated in the forward direction in the case of the incorrect polarization shown. Since the organic protective diode element 200, as described in conjunction with FIG. 2, can be implemented as an organic light-emitting element, the organic protective diode element 200 can therefore emit light in the case of a polarity reversal, so that the incorrect polarization can be visually displayed immediately.

Figure 3C:
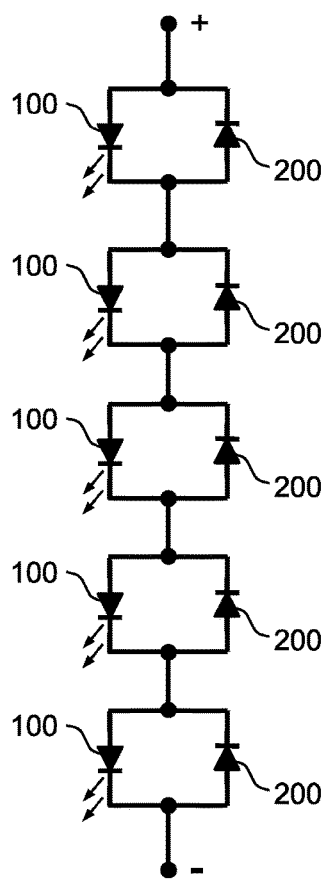
Figure 3D:
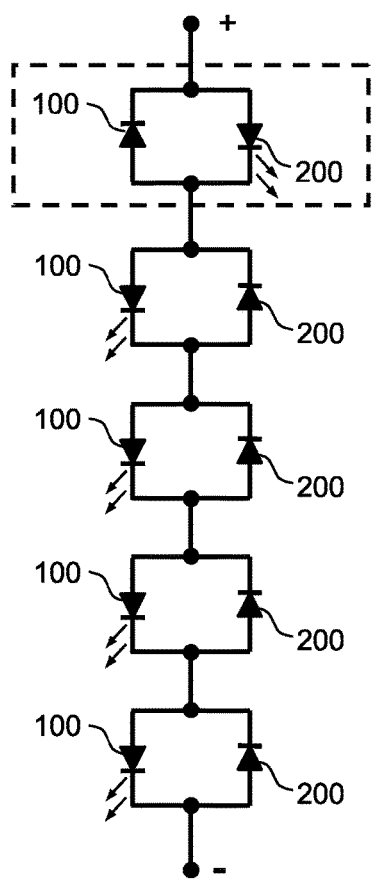

FIGS. 3C and 3D show exemplary embodiments of series circuits each having a plurality of organic optoelectronic components.

In FIG. 3C, all organic optoelectronic components are correctly connected with respect to their terminal polarization, so that all organic optoelectronic components illuminate. In FIG. 3D, the organic optoelectronic component emphasized by the dashed box is connected the wrong way around with respect to its terminal polarization, so that in this case, corresponding to the case displayed in FIG. 3B, the organic protective diode element 200 illuminates instead of the organic light-emitting element 100. In this way, the incorrectly connected organic optoelectronic component can be immediately identified, without each of the organic optoelectronic components having to be checked with respect to its terminal polarization. The incorrect connection can thus be easily corrected.

If, in the case of the polarity reversal of a component, as shown in FIG. 3D, no protective diode elements 200 interconnected in antiparallel, but rather only organic light-emitting elements in the form of typical OLEDs are provided and all OLEDs function correctly, none of the OLEDs would illuminate in the series circuit because of the OLED with reversed polarity, without an indication being given as to which of the OLEDs is connected with reversed polarity. In this case, all OLEDs would have to be checked, until the component with reversed polarity is found.

A further error source, because of which the OLEDs would not illuminate or would not illuminate correctly in a series circuit, can be the installation of a defective OLED, i.e., an OLED having a short-circuit or an open contact. Without protective diode elements 200, a defective OLED in such a series circuit, whether correctly or incorrectly connected, can only be recognizable to a very limited extent, but in most cases a check of all OLEDs would also be required here, until the defective component is found. In the case of the organic optoelectronic components described here having a protective diode element 200, in addition to the organic light-emitting component 100, at least in the event of a simultaneous polarity reversal of an organic optoelectronic component having a defective organic light-emitting element 100, it can be easily recognizable thanks to the protective diode element 200.

Figure 4A:
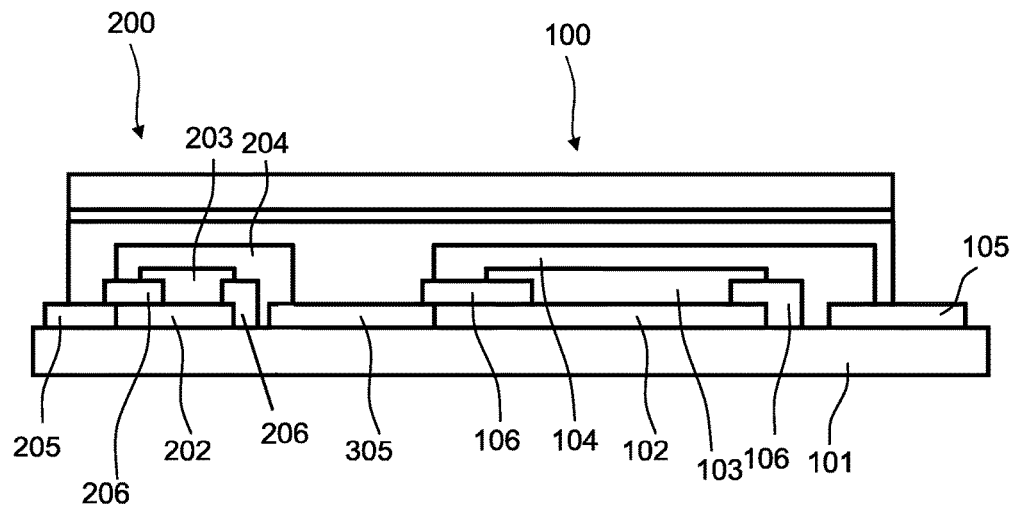
FIGS. 4A to 6 show schematic illustrations of organic optoelectronic components according to further exemplary embodiments.
Figure 4B:
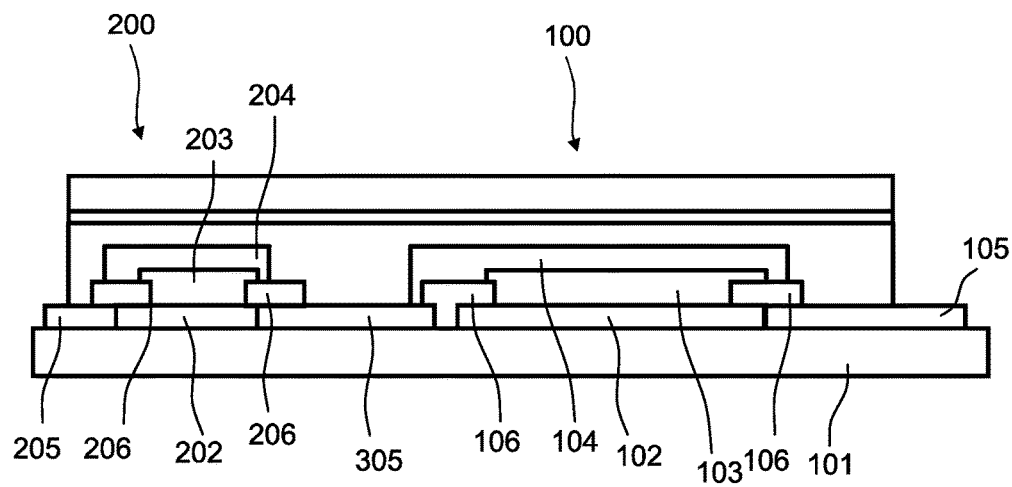

FIGS. 4A and 4B show further exemplary embodiments of organic optoelectronic components, which have an internal interconnection of at least two electrodes in each case in comparison to the exemplary embodiment of FIG. 2. For this purpose, at least one electrode of the organic light-emitting element 100 and at least one electrode of the organic protective diode element 200 are interconnected in pairs to one another in each case by an electrically conductive element of the organic optoelectronic component. In the exemplary embodiments, an electrode terminal part 305 is provided for this purpose, which can be implemented like the electrode terminal parts 105, 205. Alternatively thereto, an internal interconnection of an electrode of the organic light-emitting element 100 and an electrode of the organic protective diode element 200 can be performed by means of a part of one of the interconnected electrodes or by means of a conductor track.

In FIGS. 4A and 4B and also in the following figures, only the reference signs to which the respective description refers are shown for the sake of comprehensibility. The remaining elements can be implemented as explained in conjunction with the preceding exemplary embodiments.

In the exemplary embodiment of FIG. 4A, the electrode 102, which is arranged between the organic functional layer stack 103 and the substrate 101, of the organic light-emitting element 100 is internally interconnected to the electrode 204 of the organic protective diode element 200, which is arranged on a side of the organic functional layer stack 203 of the organic protective diode element 200 facing away from the substrate 101. The electrodes 102 and 204 have at least one electrode terminal part for an external contact, which is outside the plane of the image and is therefore not shown in FIG. 4A. In the case of the above-described terminal polarization of the elements 100, 200, this means that the anode of the organic light-emitting element 100 is internally interconnected to the cathode of the organic protective diode element 200 via the electrode terminal part 305. An interconnection of the respective other electrode of the elements 100, 200 to one another, i.e., the electrode 104 to the electrode 202, can be performed, for example, by an above-described external interconnection.

In the exemplary embodiment of FIG. 4B, the electrode 202, which is arranged between the organic functional layer stack 203 and the substrate 101, of the organic protective diode element 200 is internally interconnected to the electrode 104 of the organic light-emitting element 100, which is arranged on a side of the organic functional layer stack 103 of the organic light-emitting element 100 facing away from the substrate 101. In the case of the above-described terminal polarization of the elements 100, 200, this means that the anode of the organic protective diode element 200 is internally interconnected to the cathode of the organic light-emitting element 100 via the electrode terminal part 305. An interconnection of the respective other electrode of the elements 100, 200 to one another, i.e., the electrode 102 and the electrode 204, can be performed, for example, by an above-described external interconnection. The electrode 204 can have an electrode terminal part for a contact, which is outside the image plane and is therefore not illustrated in FIG. 4B.

Furthermore, a combination of the internal interconnection possibilities of the exemplary embodiments of FIGS. 4A and 4B is also possible.

Figure 5:
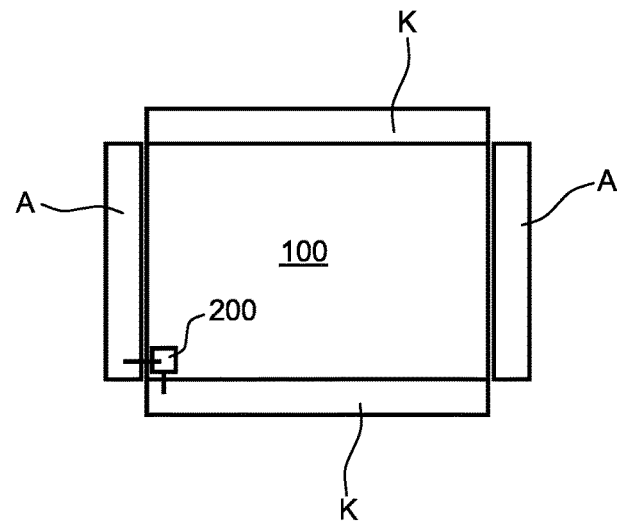

FIG. 5 shows an exemplary embodiment of an organic optoelectronic component in a top view, wherein only the positions of the organic light-emitting element 100 and the organic protective diode element 200, without precise illustration of the illuminated area and the contact feeds, are indicated for the sake of comprehensibility. Solely as an example, electrode terminal parts in the form of anode terminals A and cathode terminals K are shown on opposing sides of the illuminated area formed by the organic light-emitting element 100. In the case of a square component, a polarity reversal can occur due to an unintentional quarter turn or three-quarter turn during the installation of the component, which can easily be recognized by the organic protective diode element 200 in its function as a check diode as described above.

As shown in FIG. 5, the organic protective diode element 200 can be implemented as smaller with respect to its area occupation on the shared substrate than the organic, so that preferably the organic optoelectronic component has an illuminated area in operation which can essentially correspond to the entire area of the shared substrate and therefore as much as possible to the area of the organic light-emitting element 100.

Alternatively to the arrangement of the organic protective diode element 200 on the edge of the illuminated area, the organic protective diode element 200, as described above, can also be at least partially enclosed by the illuminated area and therefore by the organic light-emitting element 100.

Figure 6:
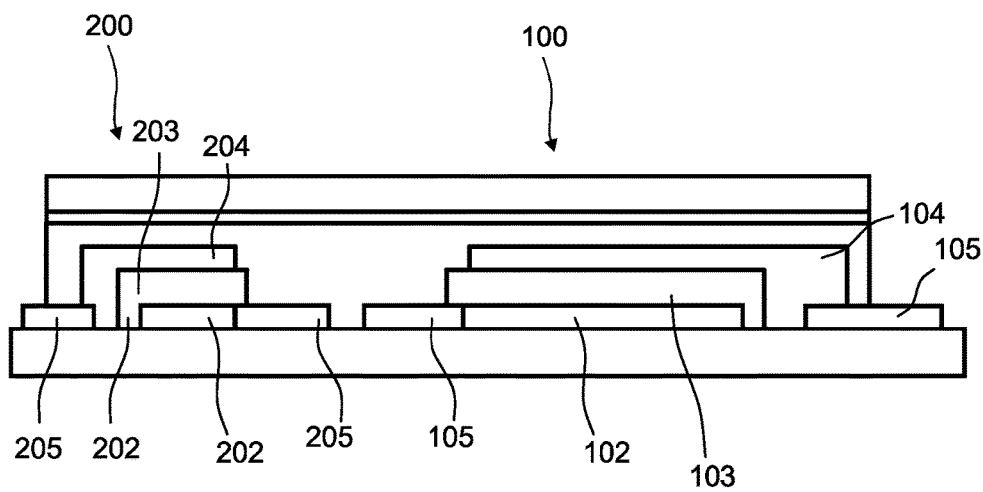

FIG. 6 shows a further exemplary embodiment of an organic optoelectronic component, in which, in comparison to the previously shown exemplary embodiments, no insulator layers 106, 206 are provided. The electrodes 102, 104 and 202, 204 are implemented by way of suitable mask processes during the production, for example, such that even without insulator layers 106, 206 and the therefore partially open organic layers, no short-circuits result. In particular, such an embodiment of the organic optoelectronic component can be combined with the internal interconnection possibilities according to FIGS. 4A and 4B.

The features and exemplary embodiments described in conjunction with the figures can be combined with one another according to further exemplary embodiments, even if such combinations are not explicitly described with the individual figures. Furthermore, the exemplary embodiments shown in the figures can have further or alternative features according to the general description.

The invention is not restricted by the description on the basis of the exemplary embodiments to the exemplary embodiments. Rather, the invention comprises every novel feature and every combination of features, which includes in particular every combination of features in the patent claims, even if this feature or this combination is not explicitly specified itself in the patent claims or exemplary embodiments.

The invention claimed is:

1. An organic optoelectronic component comprising:
   an organic light-emitting element, which has an organic functional layer stack having an organic light-emitting layer between two electrodes;
   an organic protective diode element, which has an organic functional layer stack having an organic pn-junction between two electrodes; and
   a shared substrate, wherein the organic protective diode element and the organic light-emitting element are arranged on the shared substrate in laterally adjacent area regions,
   wherein the organic protective diode element covers a smaller area on the shared substrate than the organic light-emitting element,
   wherein an electrode terminal part provides an internal interconnection, the electrode terminal part being directly located on the shared substrate, and
   wherein the electrode terminal part is located between the shared substrate and the functional layer stack along a vertical axis.

2. The component according to claim 1, wherein the organic protective diode element comprises an organic light-emitting element.

3. The component according to claim 1, wherein the area of the organic protective diode element on the shared substrate is less than or equal to 10% of the area which is covered by the organic light-emitting element on the shared substrate.

4. The component according to claim 1, wherein the organic protective diode element comprises an organic photodiode.

5. The component according to claim 1, wherein the organic functional layer stack of the organic light-emitting element and the organic functional layer stack of the organic protective diode element are implemented identically.

6. The component according to claim 1, wherein the organic light-emitting element and the organic protective diode element are interconnected in antiparallel.

7. The component according to claim 1, wherein an electrode of the organic light-emitting element that is arranged between the organic functional layer stack of the organic light-emitting element and the shared substrate is internally interconnected to an electrode of the organic protective diode element that is arranged on a side of the organic functional layer stack of the organic protective diode element facing away from the shared substrate.

8. The component according to claim 1, wherein an electrode of the organic protective diode element that is arranged between the organic functional layer stack of the organic protective diode element and the shared substrate is internally interconnected to an electrode of the organic light-emitting element that is arranged on a side of the organic functional layer stack of the organic light-emitting element facing away from the shared substrate.

9. The component according to claim 1, wherein the organic light-emitting element and the organic protective diode element are encapsulated using a shared encapsulation.

10. An organic optoelectronic component comprising:
    an organic light-emitting element, which has an organic functional layer stack having an organic light-emitting layer between two electrodes;
    an organic protective diode element, which has an organic functional layer stack having an organic pn-junction between two electrodes; and
    a shared substrate, wherein the organic protective diode element and the organic light-emitting element are arranged on the shared substrate in laterally adjacent area regions,
    wherein the organic light-emitting element and the organic protective diode element are interconnected in antiparallel,
    wherein an electrode terminal part provides an internal interconnection, the electrode terminal part being located directly on the shared substrate, and
    wherein the electrode terminal part is located between the shared substrate and the functional layer stack along a vertical axis.

11. The component according to claim 10, wherein the organic protective diode element comprises an organic light-emitting element.

12. The component according to claim 10, wherein the organic protective diode element covers a smaller area on the shared substrate than the organic light-emitting element.

13. The component according to claim 12, wherein the area of the organic protective diode element on the shared substrate is less than or equal to 10% of the area which is covered by the organic light-emitting element on the shared substrate.

14. The component according to claim 10, wherein the organic protective diode element comprises an organic photodiode.

15. The component according to claim 10, wherein the organic functional layer stack of the organic light-emitting element and the organic functional layer stack of the organic protective diode element are implemented identically.

16. The component according to claim 10, wherein an electrode of the organic light-emitting element that is arranged between the organic functional layer stack of the organic light-emitting element and the shared substrate is internally interconnected to an electrode of the organic protective diode element that is arranged on a side of the organic functional layer stack of the organic protective diode element facing away from the shared substrate.

17. The component according to claim 10, wherein an electrode of the organic protective diode element that is arranged between the organic functional layer stack of the organic protective diode element and the shared substrate is internally interconnected to an electrode of the organic light-emitting element that is arranged on a side of the organic functional layer stack of the organic light-emitting element facing away from the shared substrate.

18. The component according to claim 10, wherein the organic light-emitting element and the organic protective diode element are encapsulated using a shared encapsulation.

19. An organic optoelectronic component comprising:
an organic light-emitting element, which has an organic functional layer stack having an organic light-emitting layer between two electrodes;
an organic protective diode element, which has an organic functional layer stack having an organic pn-junction between two electrodes; and
a shared substrate, wherein the organic protective diode element and the organic light-emitting element are arranged on the shared substrate in laterally adjacent area regions,
wherein the organic light-emitting element and the organic protective diode element are interconnected in antiparallel,
wherein the organic protective diode element comprises an organic light-emitting element, and
wherein an electrode terminal part is located directly on the shared substrate and between the shared substrate and the functional layer stack along a vertical axis.

* * * * *